United States Patent
Malyshev et al.

(10) Patent No.: US 9,395,250 B2
(45) Date of Patent: Jul. 19, 2016

(54) EDDY CURRENT THERMOMETER

(71) Applicant: TSI Technologies LLC, Wichita, KS (US)

(72) Inventors: Vladimir Malyshev, Moscow (RU); Evgeni Sorkine, Moscow (RU)

(73) Assignee: TSI TECHNOLOGIES LLC, Wichita, KS (US)

( * ) Notice: Subject to any disclaimer, the term of this patent is extended or adjusted under 35 U.S.C. 154(b) by 297 days.

(21) Appl. No.: 13/960,562

(22) Filed: Aug. 6, 2013

(65) Prior Publication Data

US 2013/0315281 A1    Nov. 28, 2013

Related U.S. Application Data

(62) Division of application No. 12/904,632, filed on Oct. 14, 2010, now Pat. No. 8,523,429.

(60) Provisional application No. 61/279,229, filed on Oct. 19, 2009.

(51) Int. Cl.
| | |
|---|---|
| *G01K 7/36* | (2006.01) |
| *G01R 33/12* | (2006.01) |
| *G01R 33/028* | (2006.01) |

(52) U.S. Cl.
CPC .............. *G01K 7/36* (2013.01); *G01R 33/0283* (2013.01); *G01K 2207/02* (2013.01); *G01K 2207/06* (2013.01)

(58) Field of Classification Search
CPC ............. G01K 3/04; G01K 7/00; G01K 7/36; G01R 33/00; G01R 33/12
USPC ......... 374/141, 100, 163, 101–102, 183, 184, 374/185
See application file for complete search history.

(56) References Cited

U.S. PATENT DOCUMENTS

| | | | | |
|---|---|---|---|---|
| 3,129,355 A | * | 4/1964 | Wood .................. | H03K 4/72 315/389 |
| 3,742,178 A | * | 6/1973 | Harnden, Jr. .......... | A47J 27/002 219/385 |
| 4,290,018 A | * | 9/1981 | Rhodes ................. | G01R 33/04 324/255 |
| 4,737,716 A | * | 4/1988 | Roemer ............. | G01R 33/4215 324/318 |
| 4,970,670 A | * | 11/1990 | Twerdochlib .......... | G01K 13/08 374/163 |

(Continued)

FOREIGN PATENT DOCUMENTS

CN           101034150 A  *  9/2007

*Primary Examiner* — Gail Kaplan Verbitsky
(74) *Attorney, Agent, or Firm* — Hovey Williams LLP

(57) ABSTRACT

A remote, noncontact temperature determination method and apparatus is provided, which is operable to determine the temperature of a conducting member in operative thermal communication with an object of interest. The method comprises the steps of first inducing a closed vortex eddy current in a conducting member by subjecting the member to a magnetic field, such that the corresponding eddy current magnitude changes exponentially over time. A characteristic time constant of the exponential current magnitude changes is then determined, and this is used to calculate the temperature of the object. The apparatus includes a field transmitting coil coupled with a waveform generator for inducing the eddy current, and a field receiving coil assembly which detects the corresponding induced magnetic. Temperature determinations can be made which are substantially independent of the relative distance and/or angular orientation between the conducting member and the field receiving coil assembly.

20 Claims, 2 Drawing Sheets

(56) References Cited

U.S. PATENT DOCUMENTS

| | | | | |
|---|---|---|---|---|
| 5,122,748 A * | 6/1992 | Oh | G01R 33/4833 | 324/307 |
| 5,162,736 A * | 11/1992 | Mansfield | G01R 33/5615 | 324/309 |
| 5,655,533 A * | 8/1997 | Petropoulos | G01R 33/385 | 324/318 |
| 5,701,075 A * | 12/1997 | Xu | G01R 33/3875 | 324/318 |
| 7,162,384 B1 * | 1/2007 | Browning | G01N 27/9046 | 374/100 |
| 7,173,410 B1 * | 2/2007 | Pond | H03K 17/9547 | 324/207.12 |
| 7,173,411 B1 * | 2/2007 | Pond | H03K 17/9547 | 324/207.12 |
| 2006/0056488 A1 * | 3/2006 | Surname | G01K 7/36 | 374/184 |
| 2012/0019236 A1 * | 1/2012 | Tiernan | G01N 27/9033 | 324/234 |
| 2013/0015177 A1 * | 1/2013 | Clothier | A47J 36/027 | 219/620 |

\* cited by examiner

EDDY CURRENT THERMOMETER

CROSS-REFERENCE TO RELATED APPLICATION

This application is a division of identically-titled application Ser. No. 12/904,632, filed Oct. 14, 2010, which claims the benefit of provisional application Ser. No. 61/279,229, filed Oct. 19, 2009. These prior applications are incorporated by reference herein in their entirety.

BACKGROUND OF THE INVENTION

1. Field of the Invention

The present invention is broadly concerned with methods and apparatus for the determination of temperatures of an object by utilizing magnetic field-induced eddy currents in a conducting member forming a part of or in operative thermal communication with the object. More particularly, the invention is concerned with remote, noncontact temperature determination methods and apparatus wherein characteristic time constants of the eddy currents are ascertained and used in calculating the temperature of the conducting member.

2. Description of the Prior Art

There is a strong demand in modern industry and other fields for remote, noncontract temperature sensing devices. This demand is not satisfied by known infrared thermometers, given that these require an unobstructed line of sight for operation. The most advanced RFID circuits with integrated temperature sensing elements tend to be expensive and require reliable information transfer conditions, (e.g., RF) which restricts their use.

It is well known that alternating magnetic fields produce electromotive forces that excite eddy currents in electrically conductive objects. These currents are in the form of closed vortices, with the shape and space distribution of these vortices being defined by the alternating magnetic field pattern in space and time, and by the conductivity and magnetic properties of the conductive objects. Such closed vortices are considered as closed contours with current flow characterized by certain inductance and resistance values.

Attempts have been made in the past to utilize the eddy current phenomenon in order to measure the temperatures of the conductive objects. These efforts have not been fully successful, however. U.S. Pat. No. 5,573,613 describes a method an apparatus for sensing a temperature of a metallic bond line (susceptor) in an inductive welding process employing a conductive susceptor at the interface between two plastic parts. A magnetic work coil generates an alternating magnetic field through the plastic parts and around the susceptor. This in turn heats the susceptor, and the electrical resistance thereof changes as a function of the thermal coefficient of resistance of the susceptor material. Such resistance changes are reflected back as a change in the magnetic coil impedance. An electrical circuit senses the varying resistances, and such changes are translated into sensed temperatures. The sensed temperatures may then be used to adjust the power to the magnetic work coil, or the speed of travel of the work coil along the bond line. This technique does not require line of sight for operation. However, a significant drawback of this method is the dependence upon work coil impedance changes, which varies significantly with the distance between the work coil and the susceptor. Thus, this distance must be carefully maintained to ensure temperature measurement accuracy.

U.S. Pat. No. 3,936,734 describes remote measurement of conductivities and/or temperatures of metal components by means of the eddy current effect induced within the metal component by an alternating magnetic field. This magnetic field is produced by an excitation coil driven with alternating current arranged so that its axis perpendicular to the surface of the metal component. Also, a pair of measuring coils of equal radius are arranged coaxially and symmetrically with respect to the excitation coil at each end of the latter. The two measuring coils are connected electrically in series, and the phase angle between the current in the measuring coils and the current in the excitation coil is taken as an indication of the measured variable. In order to reduce the effect of distance changes, the measuring coils are placed at such a distance from the metal component surface that the phase angle between the excitation coil signal and the measuring signal is maximized. This method is inconvenient in practical use, however, owing to the necessity of mechanically adjusting the distances from the metal component to the sensor coils for each measurement.

See also, JP2000193531A; Ueda et al, *Development of Methodology for In-Service Measurement of Transient Responses of Process Instrument used in LMFBR*, International Corporation and Technology Development Center; Takahira et al., *Impedance Variation of a Solenoid Coil Facing a Moving Sheet Conductor*, Electrical Engineering in Japan, Vol. 103, Issue 3, pp. 1-7 (1983); and Keller, *A New Technique for Noncontact Temperature Measurement of Rotating Rolls*, Iron Steel Eng., Vol. 57, No. 5, pp. 42-44 (May 1980).

SUMMARY OF THE INVENTION

The present invention overcomes the deficiencies of the prior art eddy current temperature measurement techniques, and provides a method and apparatus for remote, noncontact temperature measurement of a conducting member (e.g., a metal, semiconductor, or liquid electrolyte) forming a part of or in operative thermal communication with an object of interest. The methods and apparatus hereof are substantially independent of the distance and/or relative angular orientation between the conducting member and a detecting coil assembly.

Broadly speaking, the invention provides a method and apparatus for determining the temperature of an object comprising the steps of inducing an eddy current in such a conducting member, wherein the eddy current is induced by subjecting the conducting member to a magnetic field having a magnitude which varies substantially linearly over time (i.e., no more than about ±30% of true linearity), such that the corresponding eddy current magnitude changes exponentially over time. Next, a characteristic time constant of the exponential current magnitude changes is determined, and the temperature of the object is calculated using this characteristic time constant.

In preferred forms, a magnetic field transmitting coil driven using a triangular waveform alternating current is employed to induce the eddy current in the conducting member, and a receiving coil assembly is provided to detect the corresponding eddy current-induced magnetic field. The output voltage of the receiving coil assembly is then used to determine the characteristic time constant. The receiving coil assembly advantageously comprises a pair of receiving coils in electrical series but of opposite phases, with the receiving coils located on opposite sides of the field transmitting coil. In order to facilitate the temperature measurement, the receiving coils are compensated so that, in the absence of the conducting member, the voltage output from the receiving coil assembly is zero.

The methods and apparatus of the invention can be used in a variety of contexts where remote, noncontact temperature sensing is desired. For example, the invention can be employed for determining the temperature of a food material during heating thereof. In such uses, a heating vessel is provided presenting a bottom wall and which is operative to hold food material. A metallic conducting member, such as an aluminum cone, is positioned on the bottom wall and has a portion thereof projecting upwardly into the food material. A temperature detecting unit is positioned in proximity to the heating vessel, and includes a first assembly operable to induce an eddy current in the conducting member, with the magnitude of the eddy current changing exponentially over time. The unit also includes a second assembly operable to determine a characteristic time constant of the eddy current magnitude changes, and to calculate the temperature of the conducting member, and hence the food material, using characteristic time constant.

DESCRIPTION OF THE PREFERRED EMBODIMENTS

Figure 2:
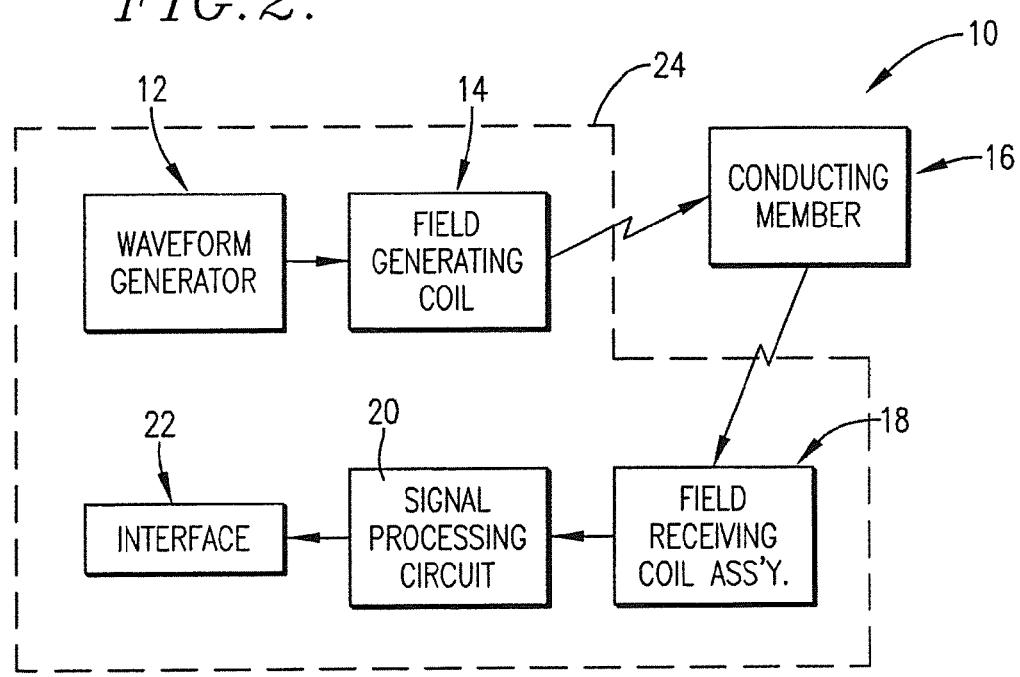
FIG. 2 is a block diagram of a preferred overall system for remote temperature measurements in accordance with the invention.

Turning now to the drawings, FIG. 2 schematically illustrates a noncontact, remote temperature sensing system 10 in accordance with the invention. The system 10 includes a wave form generator 12 operably coupled with a field transmitting coil 14 and preferably designed to provide a triangular current waveform drive current to the coil 14. The generator 12 and coil 14 serve to create an alternating magnetic field which penetrates an electrically conductive member 16. The overall system 10 further includes a field receiving coil assembly 18 coupled with a signal processing circuit 20 which may be connected with an interface 22 for further processing and displaying of the output of circuit 20. It will be appreciated that the system components 12, 14, 18, 20, and 22 may be designed in a stand alone unit 24 as an integral part of an instrument or appliance, or as individual components.

Figure 1:
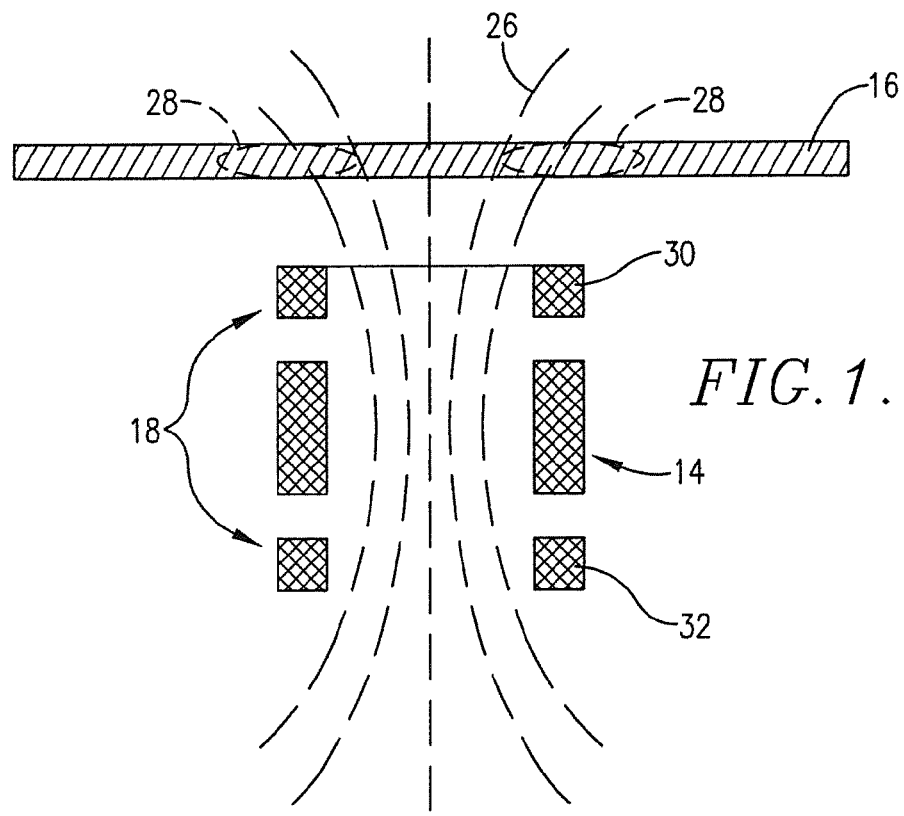
FIG. 1 is a schematic view illustrating the remote temperature sensing apparatus and method of the invention.

The basic operation of system 10 can be understood by a consideration of FIG. 1. As shown therein, the field transmitting coil 14, driven by the generator 12, produces a linearly varying in time magnetic field which penetrates the conducting member 16 (in this instance illustrated as a flat plate). Exemplary field lines 26 are shown to illustrate this effect. The magnetic field creates a stable electromotive force inducing eddy currents 28 (in the form of closed rings or contours). However, eddy current stabilization does not occur instantaneously, owing to the finite inductance L and resistance R experienced by the eddy currents 28. Rather, the eddy current magnitude I stabilizes according to a well-known exponential law:

$$I(t)=I_0\exp(-tR/L) \quad \text{(Equation 1)}$$

where t is a time variable, and $I_0$ is the stable current value.

The eddy currents 28 also generate a corresponding magnetic field which is sensed by the field receiving coil assembly 18, along with the field generated by coil 14. In this instance, the assembly 18 includes a pair of receiving coils 30, 32 which are positioned on opposite sides of and coaxially aligned with the field transmitting coil 14. The coils 30, 32 are connected in electrical series, but in opposite phases. The positions of the coils 30, 32 relative to the field transmitting coil 14 are preferably chosen such that when the conducting member 16 is not present, the voltages induced in the coils 30, 32 by the magnetic field generated by coil 14 are fully compensated, with a resulting output voltage signal of zero.

However, when the member 16 is present, the receiving coils 30,32 are respectively at different distances from the member 16; therefore, the voltage induced in receiving coil 30 (by a combination of the magnetic fields generated by field coil 14 and eddy currents 28) is significantly greater than that in coil 32. The resulting voltage output signals of the coils 30 and 32 are proportional to the rate of change of the eddy current-induced magnetic field. This is an exponential function defined by a characteristic time constant $\tau=L/R$ from Equation 1.

The eddy current inductance L is defined by the dimensions of the currents 28, which in turn are determined by the configuration of the magnetic field created by field transmitting coil 14. The eddy current resistance R is defined by these same current 28 dimensions and the electrical conductivity $\sigma$ of the conducting member 16. Given that the current 28 dimensions are stable, the time constant $\tau=L/R$ is thus proportional to the conductivity $\sigma$ of the material making up member 16. The conductivity $\sigma$ is a well-defined, monotonous function of the temperature T of the member 16:

$$\tau=A\sigma(T)=F(T) \quad \text{(Equation 2)}$$

wherein A is a constant, and the $\sigma(T)$ conductivity dependence on temperature is well-known for essentially all existing metals and alloys. The particular value of A for a given member 16 may readily be determined, for example by measuring the time constant $\tau$ at one known temperature, and using the corresponding known $\sigma$ value for that temperature.

It is thus possible to determine the temperature T of the member 16 using the measured eddy current time constant $\tau$:

$$T=F^{-1}(\tau) \quad \text{(Equation 3)}$$

where $F^{-1}$ is the inverse function of F.

In the event that the relationship between the conductivity $\sigma$ to temperature T is unknown for a given conducting member 16, the $F^{-1}(\tau)$ function may be determined empirically by measuring the time constant $\tau$ at multiple temperatures, and then curve-fitting the obtained time constant data with a polynomial or other appropriate mathematical function.

It is to be understood that the member 16 may be a zone or area of an object subjected to temperature measurement, or may be a separate member or body in operative thermal communication with the object. In either case, the temperature of the object can be accurately measured.

In principle, a single $\tau$ measurement in which the magnetic of the field transmitting coil 14 rises linearly from zero to a certain maximum is sufficient to determine a characteristic value of the time constant. However, it may be advantageous to use an alternating magnetic field of triangular waveform from the field transmitting coil 14 so that a plurality of τ measurements can be averaged in order to improve the accuracy of τ. In such a case, it is desirable that a half-period of the alternating magnetic field is substantially longer than the eddy current time constant τ.

Figure 3:
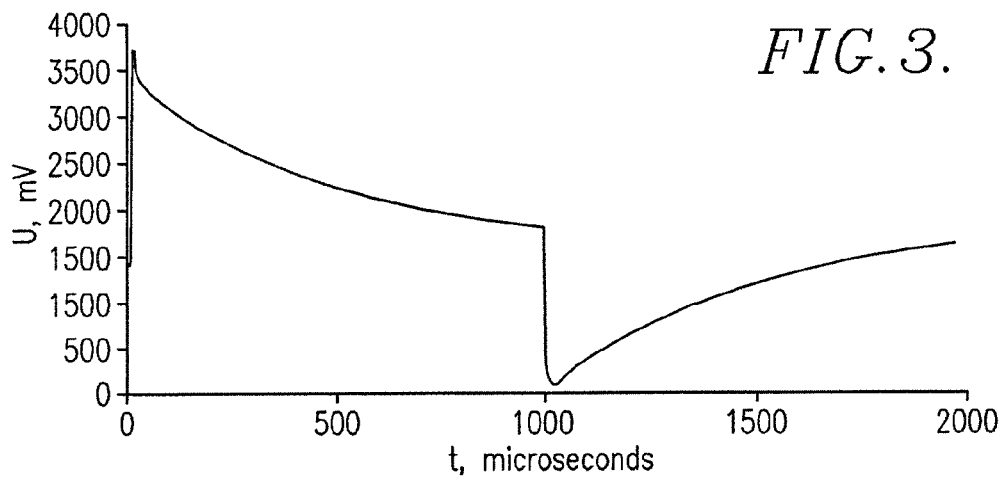
FIG. 3 is a graph illustrating a single period output voltage of a receiving coil assembly in accordance with the invention.

Referring now to FIG. 3, a single period example of the voltage output from the field receiving coil assembly 18 is illustrated. The overall system 10 was operated at a frequency of 500 Hz, with receiving coil 30 placed at a distance of 25 mm from the member 16 (formed of 2012 aluminum alloy and having a thickness of 4 mm). The time constant τ was measured to be 134 microseconds.

Figure 4:
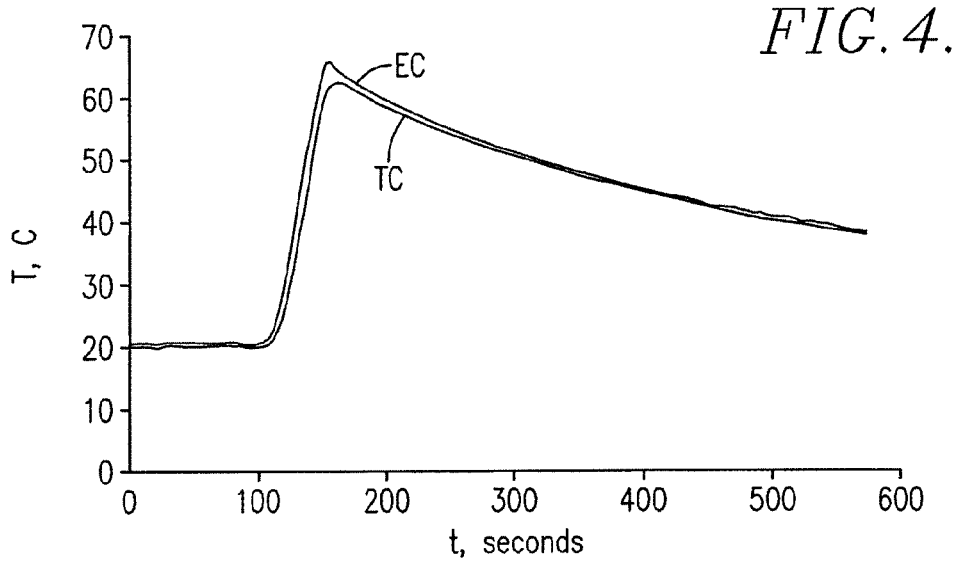
FIG. 4 is a graph illustrating the remote temperature sensing operation of the apparatus of the invention, as compared with simultaneous temperature sensing using a conventional thermocouple.

In another test, a conventional sauce pan was heated and the pan temperature was determined both by the system 10 and a conventional thermocouple. The sauce pan was formed of stainless steel and had a capacity of 1.5 liter. It was also equipped with an aluminum bottom heat spread disk sandwiched between stainless steel layers. The receiving coil 30 was placed at a 25 mm distance from the sauce pan bottom. A K-type thermocouple was also secured to the sauce pan bottom by adhesive tape and further pressed by a piece of thick cardboard. The sauce pan was heated from its inside by hot air blower for approximately 40 seconds. FIG. 4 depicts temperature vs. time graphs for both the eddy current (EC) system 10 of the invention, and the thermocouple (TC) temperatures. It can be seen that while the EC measurements consistently give exact, instantaneous temperature values, the TC exhibited a notable delay in the fast heat up interval. However, in the intervals of slow temperature changes, both methods exhibited similar accuracies. It should also be noted that, in spite of the aluminum heat spread disk being cladded between opposing layers of stainless steel, the eddy current time constant τ was in fact defined by the conductivity σ of the aluminum. This is due to the much lower conductivity of stainless steel (approximately 20 times lower than aluminum) and the small thickness of the stainless steel cladding. In essence, the contribution to the received signals from the stainless steel was negligible.

The temperature determination methods and apparatus of the invention do not rely upon a line-of-sight orientation between the system 10 and the conducting member 16. As such, the invention is very useful in numerous fields of application, e.g., repairs in the aerospace industry, control of plastic welding processes, smart cookware, and any other application where remote, noncontact, non line-of-sight temperature determination is advantageous. As noted, the object of interest to be temperature measured need not itself be conductive, but instead a separate conducting member may be used as a remote sensor when placed in thermal communication with the non-conducting object. Such separate conducting members may be shaped as pieces of conducting foil, small conducting disks, or otherwise.

Another important feature of the present invention resides in the fact that the value of the time constant τ (and thus the corresponding object temperature T) is essentially independent of the distance and/or angular orientation between the object 16 and the field receiving coil assembly 18.

For instance, a 3 mm thick aluminum disk having a diameter of 25 mm has been tested and found to show good temperature accuracy. The field transmitting coil 14 in this instance was made up of a cylindrical coil having a 50 mm outer diameter, a 50 mm height, a resistance of 21 Ohms, and an inductance of 40 mH. The field receiving coil assembly comprised separate receiving coils 30, 32 each having a diameter of 72 mm, a height of 8 mm, and with 250 turns of 0.2 mm copper wire in each coil. The coils were assembled as depicted in FIG. 1. The field transmitting coil was driven by a triangular current waveform of 500 Hz frequency and an amplitude of 0.5 A. Prior to the test, the two field receiving coils were mechanically adjusted so that the output signal therefrom in the absence of a conducting object was equal to zero.

The aluminum disk was then placed at different distances from the field receiving coil 30. The measured time constant value at 24 mm distance was 150.0±0.1 microseconds. Thereupon, the distance was decreased to 20 mm and the measured value was again 150.0±0.1 microseconds. Then the distance was increased to 28 mm, and the exact same time constant value was again determined. The conductivity of aluminum metal making up the disk varies at 0.4% per ° C. at room temperature. Hence, the temperature accuracy of this test was estimated to be ±0.17° C. Subsequently, the angle between the plane of the aluminum disk and the receiving coil 30 was altered from zero to ±15°. No changes in the measured time constant value were observed. It was thus concluded that the temperature measurement system exhibited virtually no dependence upon the distance or angular orientation of the disk, and hence the measured disk temperatures are likewise independent of these factors.

Figure 5:
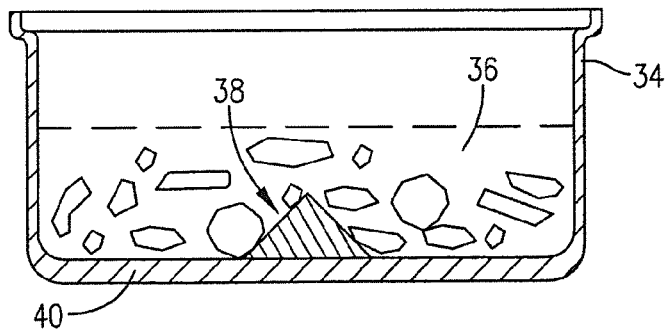
FIG. 5 is a schematic view of food material within a conventional heating pan, and the latter equipped with a conducting member permitting remote, noncontact sensing of the temperature of the food material during heating thereof.
Figure 6:
FIG. 6 is a perspective view of a conical conducting member useful in food temperature determinations.
Figure 7:
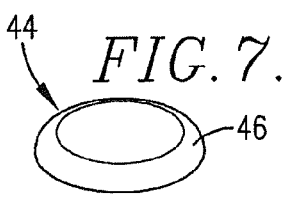
FIG. 7 is a perspective view of a circular, rounded-shoulder conducting member also useful in food temperature determinations.

The invention is particularly useful in the context of remote, noncontact temperature measurement of foods during heating thereof. For example, as illustrated in FIG. 5, a conventional stainless steel pan 34 has a volume of food material 36 therein. A conical aluminum member 38 is also within the pan 34, resting upon the bottom wall 40 thereof. With such an assembly, the temperature of the food material 36 may be readily monitored through use of a system 10 in accordance with the invention. Although a conical member 38 is preferred owing to the fact that it has a sidewall surface 42 projecting well into the volume of food material 36, other shapes may be employed. For example, FIG. 7 illustrates a member 44 which is substantially circular and has a continuous rounded shoulder 46.

Alternately, the pan 34 may be equipped with a conducting member on the outer surface of the bottom wall 40. In this embodiment, the food temperature would not be measured directly, but would still provide useful information about the food temperature. The conducting member may be in the form of a small disk embedded in or attached to the bottom wall 40.

The invention claimed is:

1. Apparatus for determining the temperature of a food material during heating thereof, comprising:
   a heating vessel operable to hold said food material and presenting wall structure;
   a conducting member positioned adjacent said wall structure;
   a first assembly comprising a magnetic field generating coil and a current generator operably coupled with the field generating coil, said current generator driving said field generating coil to produce a magnetic field having a magnitude which varies substantially linearly over time so as to induce an eddy current in said conducting member, the magnitude of said eddy current changing exponentially over time, and thereby generating a corresponding eddy current-induced magnetic field; and
   a second assembly comprising a receiving coil assembly operable to detect said eddy current-induced magnetic field and to generate an output voltage in response to the eddy current-induced magnetic field, said second assembly further including a signal processor operable to determine a characteristic time constant of said eddy current magnitude changes, and to calculate the temperature of said wall structure using said characteristic time constant.

2. The apparatus of claim 1, said conducting member formed of metal.

3. The apparatus of claim 2, said conducting member formed of aluminum.

4. The apparatus of claim 1, said conducting member positioned adjacent said wall structure on the inside of said pan, said member having a portion projecting into said food material.

5. The apparatus of claim 4, said conducting member being of conical configuration, with the bottom wall of the conducting member engaging said wall structure.

6. The apparatus of claim 4, said wall structure including a bottom wall, said conducting member positioned on said bottom wall.

7. The apparatus of claim 1, said conducting member being separable from said wall structure.

8. The apparatus of claim 1, including a waveform generator operable to drive said field generating coil using a triangular waveform alternating current.

9. A method for determining the temperature of a food material within a vessel having wall structure and a conducting member in thermal communication with said food, said method comprising the steps of:
    inducing an eddy current in said conducting member,
    said eddy current induced by subjecting said conducting member to a magnetic field generated by a field generating coil and having a magnitude which varies substantially linearly over time, such that the corresponding eddy current magnitude changes exponentially over time and thereby generates a corresponding eddy current-induced magnetic field;
    determining a characteristic time constant of said eddy current magnitude changes,
    said time constant-determining step comprising the steps of using a receiving coil assembly to detect said corresponding eddy current-induced magnetic field, said receiving coil assembly operable to generate an output voltage in response to said eddy current-induced magnetic field, and using said output voltage to determine said characteristic time constant; and
    calculating the temperature of said conducting member using said characteristic time constant as a measure of the temperature of said food material.

10. The method of claim 9, including the step of driving said transmitting coil with a triangular waveform alternating current.

11. The method of claim 10, including the step of driving said transmitting coil using an alternating magnetic field having a half-period, said half-period being substantially longer than said time constant.

12. The method of claim 9, said receiving coil assembly comprising a pair of receiving coils in electrical series but of opposite phases.

13. The method of claim 9, said conducting member formed of metal.

14. The method of claim 13, said conducting member formed of aluminum.

15. The method of claim 9, said conducting member positioned adjacent said wall structure on the inside of said pan, said member having a portion projecting into said food material.

16. The method of claim 15, said conducting member being of conical configuration, with the bottom wall of the conducting member engaging said wall structure.

17. The method of claim 15, said wall structure including a bottom wall, said conducting member positioned on said bottom wall.

18. The method of claim 9, including the step of driving said field generating coil using a triangular waveform alternating current.

19. Apparatus for determining the temperature of a food material during heating thereof, comprising:
    a heating vessel operable to hold said food material and presenting wall structure;
    a conducting member positioned adjacent said wall structure, said conducting member being separable from said wall structure;
    a first assembly comprising a magnetic field generating coil and a current generator operably coupled with the field generating coil, said field generating coil operable to induce an eddy current in said conducting member, the magnitude of said eddy current changing exponentially over time, and thereby generating a corresponding eddy current-induced magnetic field; and
    a second assembly comprising a receiving coil assembly operable to detect said eddy current-induced magnetic field and to generate an output voltage in response to the eddy current-induced magnetic field, said second assembly further including a signal processor operable to determine a characteristic time constant of said eddy current magnitude changes, and to calculate the temperature of said wall structure using said characteristic time constant.

20. A method for determining the temperature of a food material within a vessel having wall structure and a conducting member in thermal communication with said food, said method comprising the steps of:
    inducing an eddy current in said conducting member, said conducting member positioned adjacent said wall structure on the inside of said vessel, said member having a portion projecting into said food material,
    said eddy current induced by subjecting said conducting member to a magnetic field generated by a field generating coil and having a magnitude which varies substantially linearly over time, such that the corresponding eddy current magnitude changes exponentially over time and thereby generates a corresponding eddy current-induced magnetic field;
    determining a characteristic time constant of said eddy current magnitude changes,
    said time constant-determining step comprising the steps of using a receiving coil assembly to detect said corresponding eddy current-induced magnetic field, said receiving coil assembly operable to generate an output voltage in response to said eddy current-induced magnetic field, and using said output voltage to determine said characteristic time constant; and
    calculating the temperature of said conducting member using said characteristic time constant as a measure of the temperature of said food material.

* * * * *